United States Patent
Nugent et al.

(10) Patent No.: US 7,296,199 B1
(45) Date of Patent: Nov. 13, 2007

(54) SYSTEMS AND METHODS FOR DEFINING AND UTILIZING ATTRIBUTES OF A PROCESSOR RESOURCE

(75) Inventors: Patrick Brian Nugent, Fort Collins, CO (US); Kevin Lee Miller, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 835 days.

(21) Appl. No.: 10/760,736

(22) Filed: Jan. 20, 2004

Related U.S. Application Data (63) Continuation-in-part of application No. 10/442,453, filed on May 21, 2003, now Pat. No. 7,058,864.

(51) Int. Cl.
*G01R 31/28* (2006.01)
(52) U.S. Cl. .................. 714/724; 717/106; 717/140
(58) Field of Classification Search ................ 717/104, 717/145, 106, 140; 718/104; 714/724
See application file for complete search history.

(56) References Cited

U.S. PATENT DOCUMENTS

| | | | | |
|---|---|---|---|---|
| 4,398,249 A | * | 8/1983 | Pardo et al. ................. | 717/140 |
| 4,686,623 A | * | 8/1987 | Wallace ...................... | 717/143 |
| 5,115,505 A | * | 5/1992 | Bishop et al. .............. | 718/104 |
| 5,204,960 A | * | 4/1993 | Smith et al. ................. | 717/145 |
| 7,188,332 B2 | * | 3/2007 | Charisius et al. ........... | 717/104 |

* cited by examiner

*Primary Examiner*—David Ton (57) ABSTRACT

Systems and methods define and utilize processor resource attributes. Parameters of a control field for a resource are defined with at least one #define statement within source code, each #define statement having a common format to specify the parameters. The #define statement is processed to include one or more of the parameters in code generating statements within the source code. The source code is compiled into executable code, and the executable code is executed to utilize attributes of the resource.

28 Claims, 4 Drawing Sheets

SYSTEMS AND METHODS FOR DEFINING AND UTILIZING ATTRIBUTES OF A PROCESSOR RESOURCE

CROSS-REFERENCE TO RELATED APPLICATIONS

This application is a continuation-in-part of commonly-owned U.S. application Ser. No. 10/442,453, filed May 21, 2003 now U.S. Pat. No. 7,058,864 and incorporated herein by reference.

BACKGROUND

A complex processor, such as the PA-RISC processor by Hewlett-Packard, includes configurable resources that provide functionality within the processor. The controls for these resources are accessed by registers within the processor. For example, the PA-RISC processor contains more than fifty-seven, double-word, sixty-four bit remote diagnose registers ("RDRs") that control operation of the various resources within the processor (e.g., call return stack control, branch target cache ("BTC") strobe delay). These resource controls require protection from miss-use to avoid catastrophic mal-function of the processor. In an example of illustrative operation, a test engineer creates software that, when executed by the processor, verifies the processor operability by modifying the RDRs to control and test the processor resources.

Source code for the software is most often written in an assembly language, which is assembled into executable code for execution by the processor. The specification of control fields and control field locations within the RDRs is, in many cases, fragmented. For example, one resource may have many attributes, each of which is controlled by a control field in an RDR; the control fields for a resource may also be distributed over more than one RDR. One RDR may also contain more than one control field. Accordingly, in the source code, test engineers use #define statements to specify the parameters of each control field, such as: the RDR, a start bit of the associated control field, the length of the control field, default values, etc. The diversity of these parameters results in fragmented source code that is difficult to create, debug and maintain.

During development of the processor, control field locations may change; during debug of the processor, the default values for a control field often change. These changes require modification of corresponding locations in the source code. Further, re-definition of resource attributes also results in the re-definition of potentially multiple #define statements for each resource. Where multiple #define statements are used to define each control field, the readability of the source code is reduced because each #define statement requires a unique name, resulting in an undesirably long and/or cryptic name for each #define statement.

SUMMARY

In one embodiment, a method defines and utilizes attributes of a processor resource. Parameters of a control field, for the processor resource, are defined with at least one #define statement within source code. Each #define statement has a common format to specify the parameters. The #define statement is processed to include one or more of the parameters in code generating statements within the source code. The source code is compiled into executable code; and the executable code is executed to utilize attributes of the resource.

In another embodiment, a system defines and utilizes attributes of a processor resource, and includes: means for processing at least one #define statement to include parameters of a control field, for the processor resource, as code generating statements within source code, each #define statement having a common format to specify the parameters; means for compiling the source code into executable code; and means for executing the executable code to utilize attributes of the resource.

In another embodiment, a software product has instructions, stored on computer-readable media, wherein the instructions, when executed by a computer, perform steps for defining and utilizing attributes of a processor resource, including: instructions for processing at least one #define statement to include parameters of a control field, for the processor resource, as code generating statements within source code, each #define statement having a common format to specify the parameters; instructions for compiling the source code into executable code; and instructions for executing the executable code to utilize attributes of the resource.

DETAILED DESCRIPTION OF THE FIGURES

Figure 1:
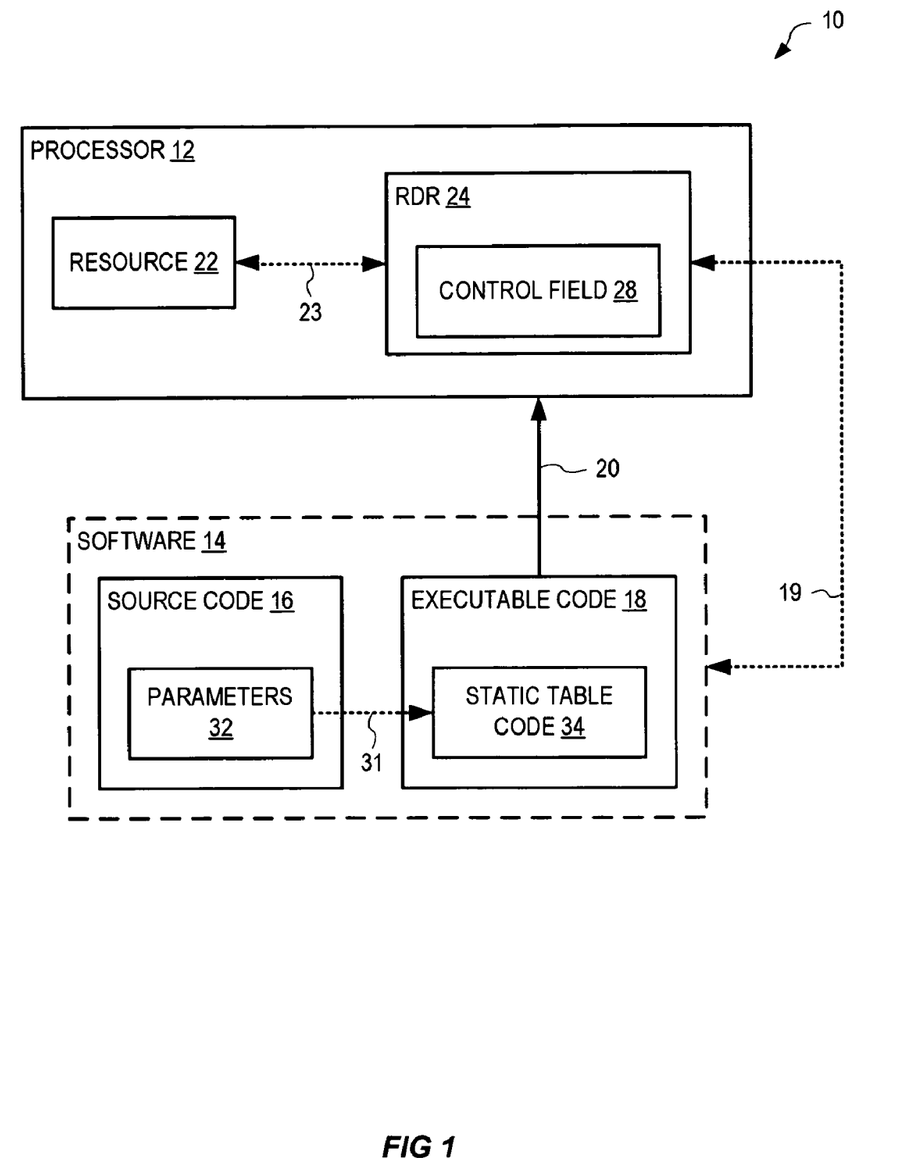
FIG. 1 illustrates one system for defining and utilizing attributes of a processor resource.

FIG. 1 illustrates one system 10 for defining and utilizing attributes of a processor resource. System 10 includes a processor 12 and software 14. Processor 12 includes a resource 22 that provides functionality within processor 12, and a remote diagnose register ("RDR") 24 that controls resource 22, as indicated by arrow 23. In one example, resource 22 provides on-chip debugging functionality used during development of processor 12. Software 14 includes source code 16 that is converted into executable code 18, as indicated by process arrow 31, and then executed by processor 12, as indicated by data path 20. Software 14 accesses RDR 24 (as indicated by control path 19) to facilitate control of resource 22. In this illustrative example, processor 12 is shown with one exemplary resource and one exemplary RDR; however, processor 12 may include additional resources and RDRs as a matter of design choice (e.g., see FIG. 3). Each RDR may contain zero or more control fields; and each resource 22 may be controlled by one or more control fields 28.

Source code 16 includes parameters 32 that define one or more parameters of control field 28. For example, parameters 32 may contain definitions for control field location, size, default value, and/or whether control field 28 is safe to modify. In one embodiment, parameters 32 are processed to generate a static table code 34 within executable code 18.

In an operational example, software 14 is used to test processor 12 during development of processor 12. During testing, processor 12 executes executable code 18 via data path 20 to test resource 22 and RDR 24. During execution of executable code 18 by processor 12, software 14 reads and writes to control field 28 (as shown by control path 19) in order to access and control resource 22.

Figure 2:
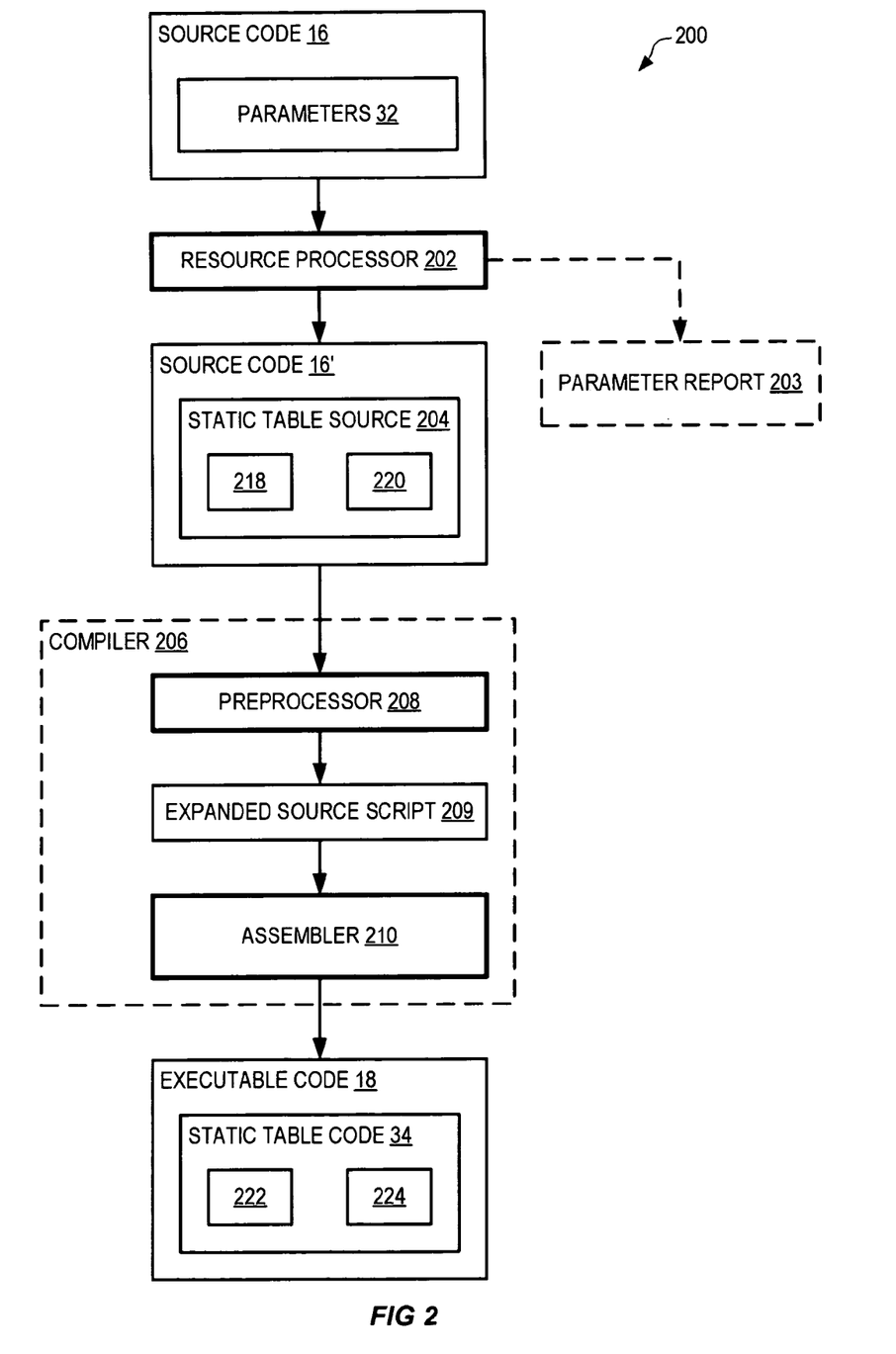
FIG. 2 is a block diagram illustrating exemplary processing of control field parameters to generate static table code.
Figure 3:
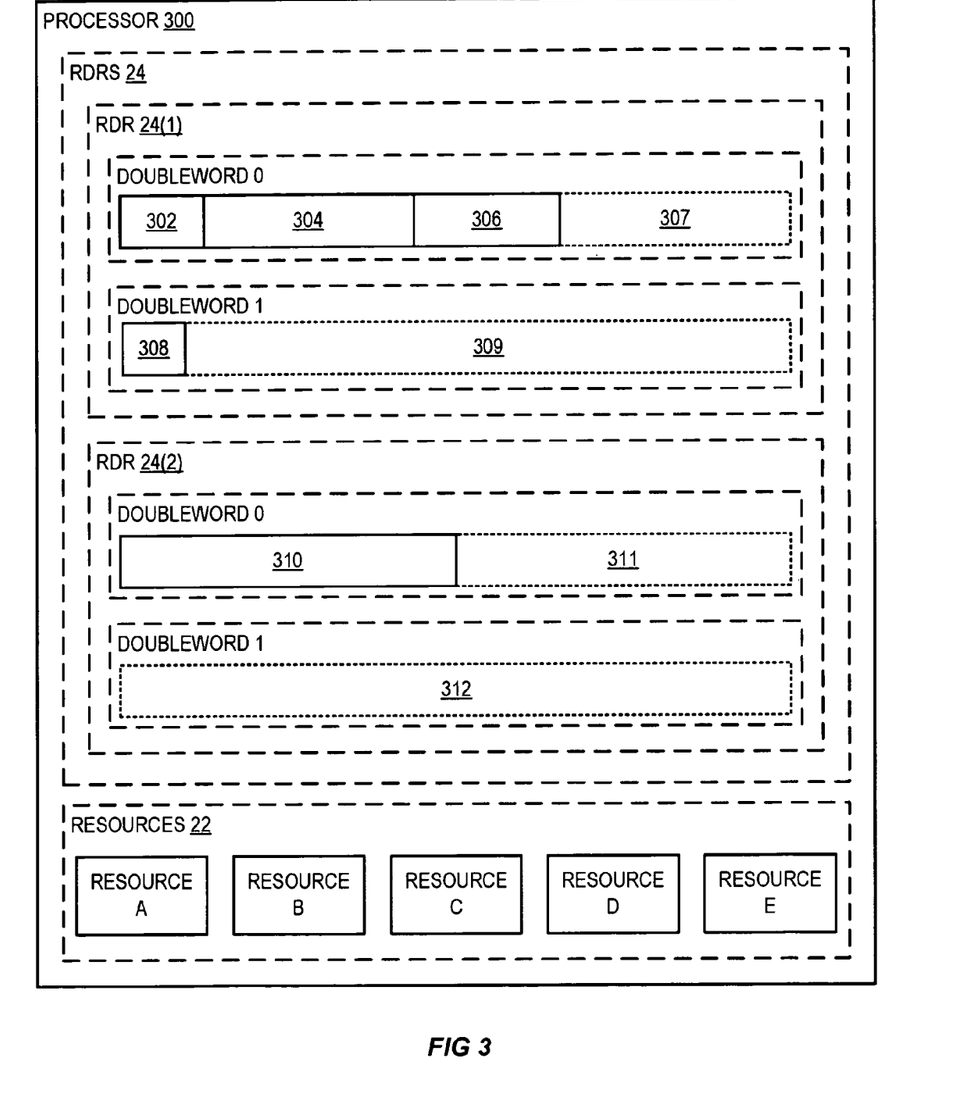
FIG. 3 illustrates exemplary use of control fields within remote diagnose registers to access and control resources of one processor.

Methods and architectures incorporating #define statements are now described in connection with FIG. 2 and FIG. 3 to illustrate definition and utilization of processor resource attributes. In one example, these methods and architectures facilitate construction and maintenance of software 14 such that unsafe modification of control field 28 is prevented during control of resource 22. Specifically, FIG. 2 is a block diagram illustrating exemplary processing of parameters 32 within source code 16 to generate static table code 34. Static table code 34 is utilized by routines within executable code 18 to prevent modification of control fields (e.g., control field 28, FIG. 1) if they are unsafe to modify. FIG. 3 illustrates a processor 300 that is for example suitable for use as processor 12, FIG. 1. Processor 300 is shown with four exemplary resources A, B, C and D accessed via control fields 302, 304, 306 and 308 of an RDR 24(1), and a fifth exemplary resource E accessed via a control field 310 of an RDR 24(2). Control field 302, 304, 306, 308 and 310 access and control resources A, B, C, D and E, respectively, as described below.

In the example of FIG. 2, source code 16 is created to access and control attributes of one or more resources A-E of processor 300; and parameters 32 define characteristics (e.g., parameters) of control fields 302, 304, 306, 308 and 310. Source code 16 is processed by a resource processor 202 to produce source code 16'. In particular, resource processor 202 reads parameters 32 and generates a static table source 204 within source code 16'. Static table source 204 includes data definition statements that define a safe mask table source 218 and a default value table source 220.

In one embodiment, resource processor 202 also generates a parameter report 203 that contains a human readable report of information contained in parameters 32. In one example, resource processor 202 generates parameter report 203 containing default values of table source 220. A software program (not shown) external to resource processor 202 may be used to process parameters 32 and generate parameter report 203.

In one embodiment, source code 16' is processed and assembled by a preprocessor 208 and assembler 210 to produce executable code 18. Preprocessor 208 processes definition and macro statements of source code 16' to produce an expanded source script 209 that includes code generating statements (i.e., statements within source script 209 that, when assembled or compiled, generate coded information for processor 300); assembler 210 then translates the expanded source script 209 into executable code 18. Preprocessor 208 and assembler 210 are for example part of a compiler 206 that reads source code 16' to produce executable code 18; however, it is appreciated that preprocessor 208 and assembler 210 may exist as two separate software tools, as a matter of design choice. Executable code 18 thus includes static table code 34 generated from static table source 204. Accordingly, static table code 34 includes a safe mask table code 222, generated from safe mask table source 218, and a default value table code 224, generated from default value table source 220, in this example.

In the example of FIG. 3, RDR 24(1) and RDR 24(2) each consist of two double-words, double-word 0 and double-word 1, where each double-word is sixty-four bits in length. Thus, RDR 24(1) and RDR 24(2) each have 128 bits, and are allocated as follows: attributes of resource A are accessed and controlled via control field 302 that utilizes bits 0-7 of double-word 0 in RDR 24(1); attributes of resource B are accessed and controlled via control field 304 that utilizes bits 8-27 of double-word 0 in RDR 24(1); attributes of resource C are accessed and controlled via control field 306 that utilizes bits 28-41 of double-word 0 in RDR 24(1); attributes of resource D are accessed and controlled via control field 308 that utilizes bits 0-5 of double-word 1 in RDR 24(1); and attributes of resource E are accessed and controlled via control field 310 that utilizes bits 0-31 of double-word 0 in RDR 24(2). Bits 42-63 of double-word 0 in RDR 24(1) are shown as a bit field 307. Bits 6-63 of double-word 1 in RDR 24(1) are shown as a bit field 309. Bits 32-63 of double-word 0 in RDR 24(1) are shown as a bit field 311. Bits 0-63 of double-word 1 in RDR 24(2) are shown as a bit field 312. Bit fields 307, 309, 311 and 312 are not used for attributes of resources 22 in the example and are defined as 'safe to change'.

In one embodiment, #define statements within parameters 32 utilize 'Attrib_Defn' syntax to define control field parameters. Definition Example 1 below uses Backus Naur Form ("BNF") notation, known in the art, to define the Attrib_Defn syntax.

Definition Example 1:

| | |
|---|---|
| <Attrib_Defn> | ::= #define <name> <item_list> |
| <item_list> | ::= <register>, <double word>, <position>, <length>, <default value>, <unsafe> |

Where:

| | |
|---|---|
| <name> | is a unique identifier used to identify the define statement. |
| <register> | identifies the register (e.g., one of RDRs 24) that contains the control field. |
| <double-word> | specifies in which double-word of the register the control field is located (e.g., 0 for double-word 0, and 1 for double-word 1). |
| <position> | specifies the bit position of the first bit of the control field within the double-word. |
| <length> | specifies the number of bits within the control field. |
| <default value_r1> | specifies a default value for the control field for processor revision 1. |
| <default value_r2> | specifies a default value for the control field for processor revision 2. |
| <unsafe> | specifies if the control field is safe to change. 0 indicates safe to change, 1 indicates unsafe to change. |

Source Code Example 1, below, illustrates exemplary #define statements of parameters 32, each formatted according to Definition Example 1 and relative to resources A-E of processor 300, FIG. 3. In Source Code Example 1, each #define statement specifies seven parameters for one control field.

Source Code Example 1:

```
#define CONTROL_FIELD_A 1, 0, 0, 8, 1, 1, 1
#define CONTROL_FIELD_B 1, 0, 8, 20, 2, 3, 0
#define CONTROL_FIELD_C 1, 0, 28, 14, 3, 4, 1
#define CONTROL_FIELD_D 1, 1, 0, 6, 4, 4, 1
#define CONTROL_FIELD_E 2, 0, 0, 32, 5, 4, 1
```

The #define statements of Source Code Example 1 assume that control fields 302, 306, 308 and 310 used to control and access resources A, C, D and E, respectively, are not safe to modify, and that control field 304, used to access and control resource B, is safe to modify. The default values for control fields 302, 304, 306, 308 and 310 for revision 1 of processor 300 are 1, 2, 3, 4 and 5, respectively; and the default values for control fields 302, 304, 306, 308 and 310 for revision 2 of processor 300 are 1, 3, 4, 4 and 4, respectively.

As shown in FIG. 2, resource processor 202 processes source code 16 to create source code 16', which includes static table source 204 generated from parameters 32. Source Code Example 2 below shows exemplary data definition statements generated from Source Code Example 1 by resource processor 202. Source Code Example 2 defines safe mask table source 218 and default value table source 220. In this example, default value table source 220 includes default values for revisions 1 and 2 of the processor. Additional or fewer processor revisions may be included in parameters 32 (and static table source 204), as a matter of design choice. Source Code Example 2:

```
; RDR 24(1) safe mask
    .word 0xff00000f, 0xffc00000
    .word 0xfc000000, 0x00000000
; RDR 24(2) safe mask
    .word 0xffffffff, 0x00000000
    .word 0x00000000, 0x00000000
; RDR 24(1) Default Values Processor Revision 1
    .word 0x01000020, 0x00c00000
    .word 0x10000000, 0x00000000
; RDR 24(2) Default Values Processor Revision 1
    .word 0x00000005, 0x00000000
    .word 0x00000000, 0x00000000
; RDR 24(1) Default Values Processor Revision 2
    .word 0x01000030, 0x00d00000
    .word 0x10000000, 0x00000000
; RDR 24(2) Default Values Processor Revision 2
    .word 0x00000004, 0x00000000
    .word 0x00000000, 0x00000000
```

In Source Code Example 2, undefined bit fields (307, 309, 311 and 312) of RDR 24(1) and RDR 24(2) are assumed safe to change with default values of zero. Source Code Example 2 utilizes assembly language data definition statements that may be assembled by assembler 210, FIG. 2, for example. Lines starting with a semi-colon are comment lines; data definition statements start with the assembly language directive '.word' and are followed by two comma-separated 32-bit hexadecimal numbers. Source Code Example 2 illustrates exemplary data definitions for safe mask table source 218 (the first four '.word' statements) and default value table source 220 (the final four '.word' statements) generated by resource processor 202 from Source Code Example 1.

In Source Code Example 2, the first '.word' line defines a mask for double-word 0 of RDR 24(1). The first eight bits of the first 32-bit word have the hexadecimal value 0xff since CONTROL_FIELD_A of Source Code Example 1 specifies control field 302 as unsafe to change. CONTROL_FIELD_B specifies control field 304 as safe to change, such that the next 20 bits of double-word 0, RDR 24(1), are defined as zero (shown as the next 5 zeros after the 0xff). CONTROL_FIELD_C defines control field 306 as not safe to change such that the next 14 bits of double-word 0 are defined as 1s. The first four bits of these 14 bits are shown as 'f' at the end of the first 32-bit word, and the remaining ten bits are shown in the second 32-bit word as specified by the characters 0xffc. The equivalent "fffc" bit string is thus fourteen bits long, matching the bit length of control field 306. The remaining bits (bit field 307) of double-word 0, RDR 24(1), are set to zero as shown by the next five zeros, completing the second 32-bit word of the first '.word' statement.

CONTROL_FIELD_D specifies that control field 308 of double-word 1, RDR 24(1), is unsafe to change; thus the first 32-bit word of the second '.word' statement starts with the hexadecimal value 0xfc. The remaining bits (bit field 309) of double-word 1 are set to zero, as shown, thus completing the unsafe mask for RDR 24(1) as 0xff00000f, 0xffc00000, 0xfc000000 and 0x00000000.

CONTROL_FIELD_E specifies that control field 310 of double-word 0, RDR 24(2), is unsafe to change. Therefore the first 32-bit word of '.word' statement three is defined as 0xffffffff. The remaining 32-bit word of '.word' statement three is defined as 0x00000000, since bit field 311 is unused and assumed safe to change (in this example). Similarly, bit field 312 of double-word 1, RDR 24(2), is unused and therefore defined by a fourth '.word' statement as 0x00000000, 0x00000000.

Similarly, default values (1, 2, 3, 4, 5), for revision 1 of processor 300, specified by the fifth parameters of CONTROL_FIELD_A, CONTROL_FIELD_B, CONTROL_FIELD_C, CONTROL_FIELD_D and CONTROL_FIELD_E statements, respectively, are included in static table source 204 by the next four '.word' statements. Default values (1, 3, 4, 4, 4), for revision 2 of processor 300, specified by the sixth parameters of CONTROL_FIELD_A, CONTROL_FIELD_B, CONTROL_FIELD_C, CONTROL_FIELD_D and CONTROL_FIELD_E statements, respectively, are included in static table source 204 by the next four '.word' statements. Upon reading and fully appreciating this disclosure, one of ordinary skill in the art appreciates that other tables may be similarly generated by resource processor 202 to contain resource attribute information.

Source code 16' is then processed by preprocessor 208 and assembled into executable code 18 by assembler 210. Executable code 18 thus contains static table code 34 that is generated from static table source 204 and that includes safe mask table code 222 and default value table code 224. Safe mask table code 222 and default value table code 224 are used by routines of executable code 18 to prevent unsafe changes to control fields 302, 306, 308 and 310, and to provide default values for the control fields. For example, code may be written in source code 16 to modify control fields 302 and 304 of RDR 24(1) to change attributes of resources A and B. However, since RDR 24(1) and RDR 24(2) are accessed as 128 bit values, and since control fields 302, 304, 306 and 308 of resources A, B, C, and D, respectively, are co-located in RDR 24(1), control fields of resources A, B, C and D are all written simultaneously.

In this example, source code 16 does not intend to change control fields associated with resources C and D. Therefore, a read-modify-write technique, known in the art, is used to modify control fields 302 and 304 of resources A and B without modifying control fields 306 and 308 of resources C and D. For example, Register Pattern 1, below, shows an initial value of RDR 24(1). In Register Pattern 1, control field 302 has a hexadecimal value of 0xAA and control field 304 has a hexadecimal value of 0x12345 (control fields 306 and 308 have zero values). In this example, executable code 18, FIG. 1, attempts to change control field 302 to 0xBB and control field 304 to 0x99999. Executable code 18 reads RDR 24(1) (e.g., temporarily storing the value in a working register of processor 300) and modifies control fields 302 and 304 of the read value, resulting in Register Pattern 2.

Register Pattern 1:
   0xAA123450 0x000EEEEE 0x01234567 0x89ABCDEF

Register Pattern 2:
   0xBB999990 0x000EEEEE 0x01234567 0x89ABCDEF

As control field 302 is defined as unsafe to change, writing a different value to control filed 302 is undesirable. To prevent potential catastrophic failure of processor 300, any change to control field 302 is therefore avoided. In one embodiment, a logic equation (e.g., Logic Statement 1, below) is used with safe mask table code 222 to prevent unwanted changes to control fields that are unsafe to change. In Logic Statement 1, "IN" is the new register value (e.g., Register Pattern 2), "CUR" is the current register value (e.g., Register Pattern 1), "UNSAFE" is a bit pattern retrieved from safe mask table code 222 and associated with RDR 24(1) (shown as RDR 24(1) Safe Mask, below), and "OUT" is the bit pattern written to RDR 24(1). All operators are bitwise.

RDR 24(1) Safe Mask:
   0XFF00000F 0XFFC00000 0XFC000000 0X000000000

Logic Statement 1:
   OUT=(CUR AND UNSAFE) OR (IN NAND UNSAFE)

Accordingly, the utilization of Logic Statement 1 when modifying resource attributes results in protection of control fields that are unsafe to change while allowing modification of control fields that are safe to change.

Continuing with the example, Logic Statement 1 is used to prevent unsafe changes to RDR 24(1) by applying RDR 24(1) Safe Mask, retrieved from safe mask table code 222, to Register Pattern 2, which changes RDR 24(1) from Register Pattern 1 to Register Pattern 3.

Register Pattern 3:
   0xAA999990 0x000EEEEE 0x01234567 0x89ABCDEF

By comparing Register Pattern 3 to Register Pattern 1, it can be seen that control field 302 is not modified and control field 304 is modified. Thus, by using Logic Statement 1 together with safe mask table code 222 of static table code 34, resource A is protected from unsafe change while resource B is modified.

In another example, static table code 34 is utilized during testing of registers (e.g., RDRs 24) of processor 300. If a control field within a register of processor 300 is safe to modify (such as control field 304 of RDR 24(1)), then it is safe to modify bits associated with the control field during testing of the register. If the control field is not safe to modify, then it is not safe to modify bits associated with the control field during testing of the register. In one example, test patterns are written to registers (e.g., RDRs 24) of processor 300 and then read to verify that the registers retain written values. Test routines thus may utilize static table code 34 and Logic Statement 1 when determining test patterns to be written to the registers. Further, after testing, default values may be restored to the registers using values from default value table code 224, for example.

In another example, default value table code 224 is used during initialization to configure resources A-E of processor 300. In the example, default values for each register (e.g., RDR 24(1) and RDR 24(2)) of RDRs 24 are loaded from default value table 224 during initialization of processor 300, thereby setting processor 300 to a defined operating status.

In another embodiment, a macro statement within source code 16 is used to extract one parameter value from define statements of parameters 32. For example, a macro called 'WhatRDR' (shown below in WhatRDR Macro Definition) is defined in source code 16 and used to select the first item (RDR) in the list of items specified by define statements of parameters 32, as illustrated in WhatRDR Use Example below:

WhatRDR Macro Definition
   #define WhatRDR (p1, p2, p3, p4, p5, p6, p7) p1

WhatRDR Use Example
   addi r1,WhatRDR(CONTROL_FIELD_E)

In the WhatRDR Use Example, the WhatRDR macro selects the RDR parameter (i.e., the <register> parameter of Definition Example 1) of CONTROL_FIELD_E (defined in Source Code Example 1). Processor instruction 'addi' thus adds a value of 2 to register r1.

CpuStoreField Macro Definition, below, illustrates one exemplary macro that uses three parameters of a define statement of parameters 32 to store a value in a specific field (e.g., field 304 of processor 300) of a specified register. In particular, macro CpuStoreField implements the read-modify-write technique to modify a field in a target register with a value from a source register, without modifying bits outside the specified field in the target register.

CpuStoreField Macro Definition

| CpuStoreField | .MACR0 |
|---|---|
| Src, Reg, Off, Pos, Len, Def1, Def2, Safe, Tar, Scr | |
| ldd | 8*Off (Tar), Scr |
| depd | Src, Pos, Len, Scr |
| std | Scr, 8*Off(Tar) |
| | .endm |

The first line of CpuStoreField Macro Definition declares macro CpuStoreField with ten parameters 'Src', 'Reg', 'Off', 'Pos', 'Len', 'Def1', 'Def2', 'Safe', 'Tar', and 'Scr'. The first parameter, 'Src', identifies a source register, parameters 'Reg', 'Off', 'Pos', 'Len', 'Def1', 'Def2' and 'Safe' match define statement parameters <register>, <double-word>, <position>, <length>, <default value_r1>, <default value_r2> and <unsafe>. Parameters 'Tar' and 'Scr' specify, respectively, the target register for the field value and a scratch register that is used to store working values during execution of macro CpuStoreField processor instructions. In this example, macro CpuStoreField uses parameters 'Off', 'Pos' and 'Len', although all parameters of parameter 32 define statements are specified in the CpuStoreField macro declaration to maintain parameter ordering.

The second line of CpuStoreField Macro Definition is a processor instruction that reads the contents of the target register (i.e., the read part of the read-modify-write technique), storing the read value in the defined scratch register 'Scr'. Parameter 'Off' specifies the double-word of the target register containing the specified field, and, in this exemplary instruction, is multiplied by 8 as each double word is eight bytes long.

The third line of CpuStoreField macro Definition is a processor instruction that deposits the value specified in the source register, 'Src', into the scratch register 'Scr' at a position starting at 'Pos' and with a length of 'Len' bits.

The fourth line of CpuStoreField macro Definition is a processor instruction that stores the contents of the scratch register 'Scr' into target register 'Tar', thus completing the read-modify-write technique. CpuStoreField Use Example, below, illustrates one exemplary invocation of CpuStoreField macro to write a value to field 310 of processor 300, by selecting parameters of CONTOL_FIELD D.

CpuStoreField Use Example
    CpuStoreField %r4,CONTROL_FIELD_D, %r3, %r5

In CpuStoreField Use Example, CpuStoreField has four parameters, %r4, CONTROL_FIELD_D, %r3 and %r5. The first parameter, %r4, identifies a source register that contains the value to be stored in field 310. The second parameter, CONTOL_FIELD_D, is a #define statement of Source Code Example 1. The third parameter, %r3, identifies the target register, RDR 24(2) of processor 300 in this example; and the fourth parameter, %r5, is a scratch register. CpuStoreField Use Example (stored in source code 16', FIG. 2, for example) is expanded by preprocessor 208, FIG. 2, into CpuStoreField Resulting Code (stored in expanded source script 209, for example).

CpuStoreField Resulting Code

| | |
|---|---|
| ldd | 8*1(%r3), %r5 |
| depd | %r4, 0, 6, %r5 |
| std | %r5, 8*1(%r3) |

In CpuStoreField Resulting Code, parameters 'Off', 'Pos', and 'Len' of macro CpuStoreField have been replaced by parameters two, three and four of CONTROL_FIELD_D (values 1, 0 and 6), respectively, to produce code generating statements (stored, for example, in expanded source script 209) that contain parameters of #define statement CONTROL_FIELD_D.

Figure 4:
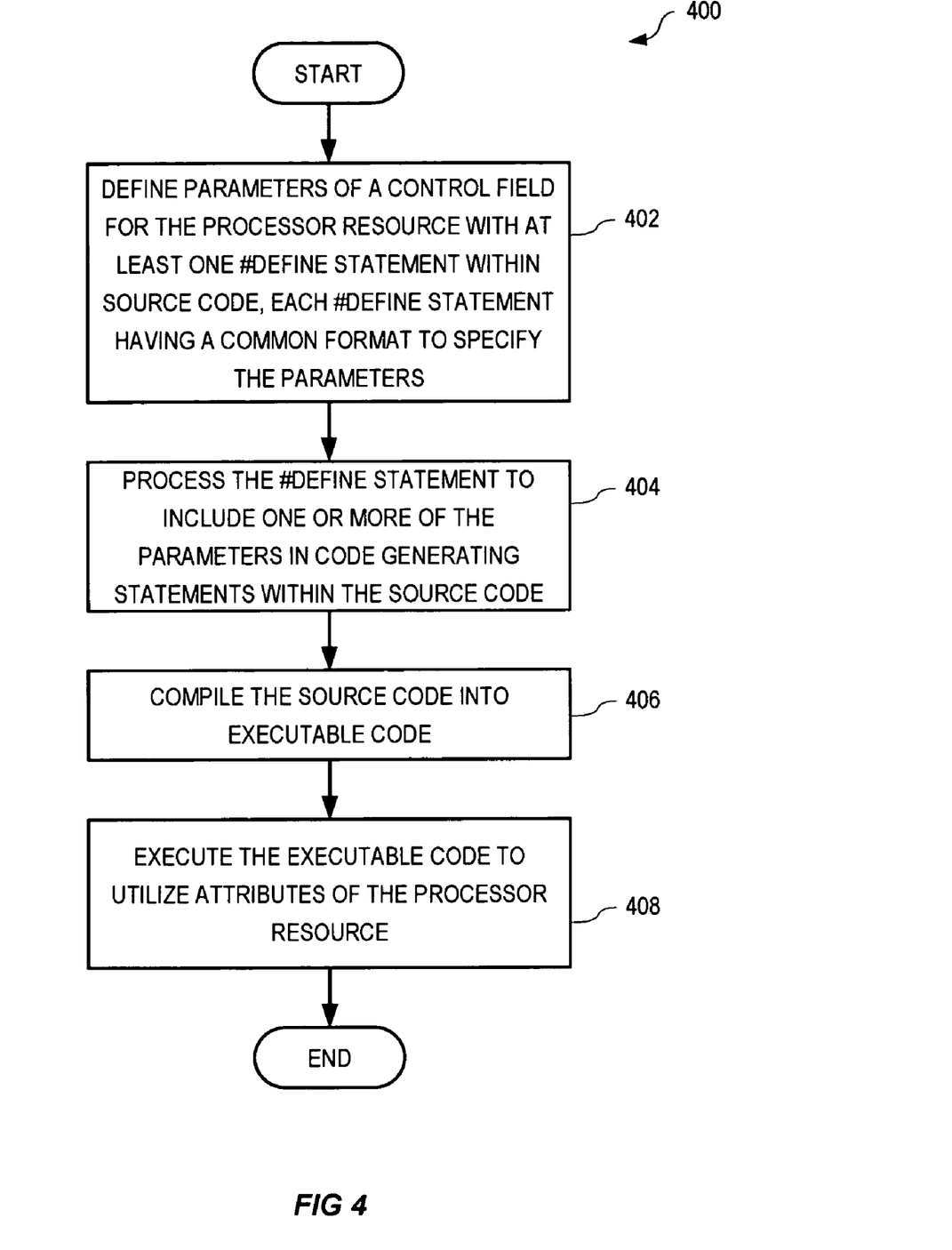
FIG. 4 is a flowchart illustrating one process for defining and utilizing attributes of a processor resource.

FIG. 4 is a flowchart illustrating one process 400 for defining and utilizing attributes of a processor resource. In step 402, process 400 defines parameters of a control field for the processor resource with at least one #define statement within source code, each #define statement having a common format to specify the parameters. IN step 404, process 400 processes the #define statement to include one or more of the parameters in code generating statements within the source code. In step 406, process 400 compiles the source code into executable code. In step 408, process 400 executes the executable code to utilize attributes of the processor resource.

Upon reading and comprehending the above disclosure, one of ordinary skill in the art appreciates that the use of methods and systems described herein facilitate maintenance of software 14 when resource attributes change. Particularly, when control field locations and default values change, only modification of #define statements that define control field parameters within the software is required. Further, the above described use of #define statements improves readability and consistency of the software, thereby reducing errors during creation, maintenance and debug of the software and the processor.

Changes may be made in the above methods, apparatus and systems without departing from the scope hereof. It should thus be noted that the matter contained in the above description or shown in the accompanying drawings should be interpreted as illustrative and not in a limiting sense. In particular, the control field parameters, used in the above examples, are illustrative and should not be considered limiting. For example, default values are included for two revisions of processor 300 for clarity if illustration; additional default parameters for additional revisions of processor 300 may be included as a matter of design choice. The following claims are intended to cover all generic and specific features described herein, as well as all statements of the scope of the present method and system, which, as a matter of language, might be said to fall there between.

What is claimed is:

1. A method for defining and utilizing attributes of a processor resource, comprising:
    defining parameters of a control field for the processor resource with at least one #define statement within source code, each #define statement having a common format to specify the parameters;
    processing the #define statement to include one or more of the parameters in code generating statements within the source code;
    compiling the source code into executable code; and
    executing the executable code to utilize attributes of the processor resource.

2. The method of claim 1, the step of processing comprising generating static table source from the #define statement, the static table source tabulating one or more parameters of the control field.

3. The method of claim 2, the step of generating static table code comprising generating assembly language data definitions of the one or more parameters.

4. The method of claim 2, the step of generating static table code comprising specifying a safe mask for the control field.

5. The method of claim 4, further comprising utilizing the safe mask to logically prevent unwanted modification of the control field.

6. The method of claim 2, the step of generating static table code comprising specifying one or more default values for the control field.

7. The method of claim 6, the step of specifying one or more default values comprising specifying one or more default values for one or more revisions of a processor.

8. The method of claim 1, the step of defining parameters comprising defining location and size of the control field within the processor.

9. The method of claim 1, further comprising the step of specifying at least one macro command to extract one or more parameters from the #define statement, wherein the step of compiling comprises invoking the macro command one or more times in the source code.

10. The method of claim 9, the step of specifying at least one macro command comprising specifying source code that uses the one or more extracted parameters.

11. The method of claim 1, further comprising generating a human readable report containing information of the #define statement.

12. The method of claim 1, the step of executing comprising utilizing the parameters to prevent unsafe modification of the processor resource, the #define statement specifying (a) a register that contains the control field and (b) whether the control field is safe to modify, and further comprising generating static table source from the #define statement to specify a safe mask for the register, and logically determining a bit pattern to be written to the register based upon a current register value, the safe mask and a new register value.

13. The method of claim 12, wherein the #define statement further specifies a location and a size of the control field within the register, and further comprising writing the bit pattern to the register such that either (a) a new value is written to the control field when the control field is safe to modify or (b) a current value is written to the control field when the control field is not safe to modify.

14. The method of claim 12, wherein the #define statement further specifies a location and a size of the control field within the register and wherein the safe mask comprises a bit pattern of equal size to the register, and further comprising setting each bit of a bit field within the safe mask to zero if the attribute is safe to modify and setting each bit of the bit field within the safe mask to one if the attribute is not safe to modify, wherein the bit field is the same size as the control field and is located at the same bit position in the safe mask as the control field within the register.

15. The method of claim 12, the step of generating comprising generating a static table source by processing the #define statement, the static table source comprising assembly language data definitions defining the safe mask, the step of compiling comprising compiling the static table source into the static table code.

16. The method of claim 12, wherein the step of generating further comprises generating the static table source with at least one default value for the register, the default value generated from the #define statement.

17. A system for defining and utilizing attributes of a processor resource, comprising:
means for processing at least one #define statement to include parameters of a control field, for the processor resource, as code generating statements within source code, each #define statement having a common format to specify the parameters;
means for compiling the source code into executable code; and
means for executing the executable code to utilize attributes of the resource.

18. The system of claim 17, further comprising means for generating static table source from the #define statement to specify one or more parameters of the control field.

19. The system of claim 18, further comprising means for generating assembly language data definitions.

20. The system of claim 18, further comprising means for specifying a safe mask for the control field.

21. The system of claim 20, further comprising means for utilizing the safe mask to logically prevent unwanted modification of the control field.

22. The system of claim 18, further comprising means for specifying one or more default values for the control field.

23. The system of claim 22, further comprising means for specifying one or more revisions of a processor.

24. The system of claim 17, further comprising means for defining location and size of the control field within a processor.

25. The system of claim 17, further comprising means for specifying at least one macro command to extract one or more parameters from the #define statement, and means for invoking the macro command one or more times in the source code.

26. The system of claim 25, further comprising means for specifying source code that uses the one or more extracted parameters.

27. The system of claim 17, further comprising means for generating a human readable report containing information of the #define statement.

28. A software product comprising instructions, stored on computer-readable media, wherein the instructions, when executed by a computer, perform steps for defining and utilizing attributes of a processor resource, comprising:
instructions for processing at least one #define statement to include parameters of a control field, for the processor resource, as code generating statements within source code, each #define statement having a common format to specify the parameters;
instructions for compiling the source code into executable code; and
instructions for executing the executable code to utilize attributes of the resource.

* * * * *

UNITED STATES PATENT AND TRADEMARK OFFICE
CERTIFICATE OF CORRECTION

PATENT NO. : 7,296,199 B1 Page 1 of 1
APPLICATION NO. : 10/760736
DATED : November 13, 2007
INVENTOR(S) : Patrick Brian Nugent et al.

It is certified that error appears in the above-identified patent and that said Letters Patent is hereby corrected as shown below:

In column 7, line 21, delete "0X000000000" and insert -- 0X00000000 --, therefor.

In column 8, line 27, delete ".MACR0" and insert -- .MACRO --, therefor.

Signed and Sealed this

Tenth Day of June, 2008

JON W. DUDAS
*Director of the United States Patent and Trademark Office*